(12) United States Patent
Kawahito et al.

(10) Patent No.: US 6,919,750 B2
(45) Date of Patent: Jul. 19, 2005

(54) CLOCK SIGNAL GENERATION CIRCUIT USED FOR SAMPLE HOLD CIRCUIT

(75) Inventors: Shoji Kawahito, Hamamatsu (JP); Daisuke Miyazaki, Hamamatsu (JP)

(73) Assignee: Semiconductor Technology Academic Research Center, Yokohama (JP)

(*) Notice: Subject to any disclaimer, the term of this patent is extended or adjusted under 35 U.S.C. 154(b) by 0 days.

(21) Appl. No.: 10/684,449

(22) Filed: Oct. 15, 2003

(65) Prior Publication Data

US 2004/0080349 A1 Apr. 29, 2004

(30) Foreign Application Priority Data

Oct. 16, 2002 (JP) ........................................ 2002-302045

(51) Int. Cl.[7] .............................................. G06F 1/04
(52) U.S. Cl. ..................................... 327/295; 327/258
(58) Field of Search ................................ 327/291–299, 327/156–161, 152, 172–176, 257, 258; 375/376

(56) References Cited

U.S. PATENT DOCUMENTS

| | | | | |
|---|---|---|---|---|
| 3,596,188 A | * | 7/1971 | Hasse | 327/238 |
| 3,735,277 A | * | 5/1973 | Wanlass | 331/45 |
| 5,087,829 A | * | 2/1992 | Ishibashi et al. | 327/152 |
| 5,532,633 A | * | 7/1996 | Kawai | 327/174 |
| 6,137,336 A | * | 10/2000 | Baba et al. | 327/295 |

OTHER PUBLICATIONS

Technical Digest p. 396, p. 397 and p. 470 of International Solid–State Circuit Conference of US Institute of Electrical and Electronics Engineers. Lin Wu et al (Feb., 2001).

* cited by examiner

Primary Examiner—Minh Nguyen
(74) Attorney, Agent, or Firm—Birch, Stewart, Kolasch & Birch, LLP

(57) ABSTRACT

A master DLL circuit (3) generates a first delay signal (CKD) by delaying the master clock signal by a first delay time (T0) and generates a first pulse signal (Smp) having a pulse width (T0) of the first delay time, and generates a first control signal (Scp) which is changed in accordance with the first pulse signal (Smp), and adjusts the first delay time (T0) in accordance with the first control signal (Scp). Each slave DLL circuit (D1 to Dm) delays, by a second delay time (td), a delay internal clock signal, and outputs the delayed delay internal clock signals (CK1 to CKm) which form the multiphase clock signals. Each slave DLL circuit generates a second pulse signal (Ssp) having a pulse width (td) of the second delay time, and generates a second control signal (Scp1) which is changed in accordance with the first and second pulse signals (Smp, Ssp), and adjusts the second delay time (td) in accordance with the second control signal (Scp1), thus reducing a skew value of the multiphase clock signal.

7 Claims, 8 Drawing Sheets

CLOCK SIGNAL GENERATION CIRCUIT USED FOR SAMPLE HOLD CIRCUIT

This nonprovisional application claims priority under 35 U.S.C. § 119(a) on Patent Application No. 2002-302045 filed in JAPAN on Oct. 16, 2002, which is herein incorporated by reference.

BACKGROUND OF THE INVENTION

1. Field of the Invention

The present invention generally relates to a clock signal generation circuit, and particularly to a clock signal generation circuit for generating a multiphase clock signal used for a sample hold circuit (hereafter referred to as "S/H circuit") for interleave operations.

2. Description of the Related Art

In conventional multiphase clock signal generation techniques, there has been used a clock signal generation circuit which compares delay values of three clock signals in a predetermined combination of clock signals $\phi 1$ to $\phi 8$ of eight phases and which controls delay values of the clock signals $\phi 1$ to $\phi 8$ in accordance with the comparison result. (For example, refer to Non-patent Document 1: Technical Digest p. 396, p. 397, and p. 470 of International Solid-State Circuit Conference of US Institute of Electrical and Electronics Engineers in February, 2001).

However, in the conventional interleave operations of interleave S/H circuits, there is a problem of a skew which occurs as a deviation caused in a timing of a clock signal for controlling a sampling switch from an ideal value in timing of the clock signal, and therefore a harmonic distortion undesirably occurs and an SNDR (Signal to Noise and Distortion Ratio) is deteriorated.

FIG. 11 is a graph showing a relation between a skew $\sigma$ and a SNDR in the case of an input signal frequency of 50 MHz and a sampling frequency of 100 MHz. As shown in FIG. 11, even when a sampling frequency is 100 MHz and a resolution of an A/D converter connected after an S/H circuit is 10 bits, it is necessary to suppress a skew value to 2 ps or less. However, in the conventional multiphase clock signal generation circuit, it is impossible to decrease the skew value to 2 ps or less.

SUMMARY OF THE INVENTION

The present invention is made to solve the above problems and its object is to provide a clock signal generation circuit capable of reducing a skew value of a generated multiphase clock signal and particularly capable of reducing a skew value to 2 ps or less even when the resolution of an A/D converter connected after an S/H circuit is 10 bits when supplying a multiphase clock signal to the S/H circuit for interleave operations.

In order to achieve the object mentioned above, a first aspect of the present invention provides a clock signal generation circuit for generating multiphase clock signals in accordance with a master clock signal having a predetermined frequency, which includes: a master DLL circuit section adapted to generate a first delay signal obtained by delaying the master clock signal by a first delay time and generate a first pulse signal having a pulse width of the first delay time in accordance with the master clock signal and the first delay signal; a multiphase clock generation circuit section adapted to generate multiphase internal clock signals in accordance with the master clock signal and generate delay internal clock signals obtained by delaying the multiphase internal clock signals, respectively; and a slave DLL circuit section constituted by slave DLL circuits each for delaying, by a second delay time, corresponding one of the delay internal clock signals generated by the multiphase clock generation circuit section, thereby outputting the delayed delay internal clock signals which form the multiphase clock signals.

In this configuration, the master DLL circuit section generates a first control signal which is changed in voltage in accordance with the first pulse signal, and adjusts the first delay time to have a first predetermined value in accordance with the generated first control signal, and each of the slave DLL circuits generates a second pulse signal having a pulse width of the second delay time, and generates a second control signal which is changed in voltage in accordance with the first and second pulse signals, and adjusts the second delay time to have a second predetermined value in accordance with the generated second control signal.

A second aspect of the present invention provides a clock signal generation circuit for generating multiphase clock signals in accordance with a master clock signal having a predetermined frequency, which includes: a common clock generation circuit section adapted to generate a third delay signal obtained by delaying the master clock signal by a third delay time and generate a third pulse signal having a pulse width of the third delay time in accordance with the master clock signal and the third delay signal; a multiphase clock generation circuit section adapted to generate multiphase internal clock signals in accordance with the master clock signal; and a clock control circuit section constituted by clock control circuits each for controlling a change point of a signal level of corresponding one of the internal clock signal outputted from the multiphase clock generation circuit section to be coincident with a change point of a signal level of the third pulse signal.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DETAILED DESCRIPTION OF THE PREFERRED EMBODIMENTS

The present invention is described below in detail in accordance with the embodiments shown in the accompanying drawings.

First Embodiment

Figure 1:
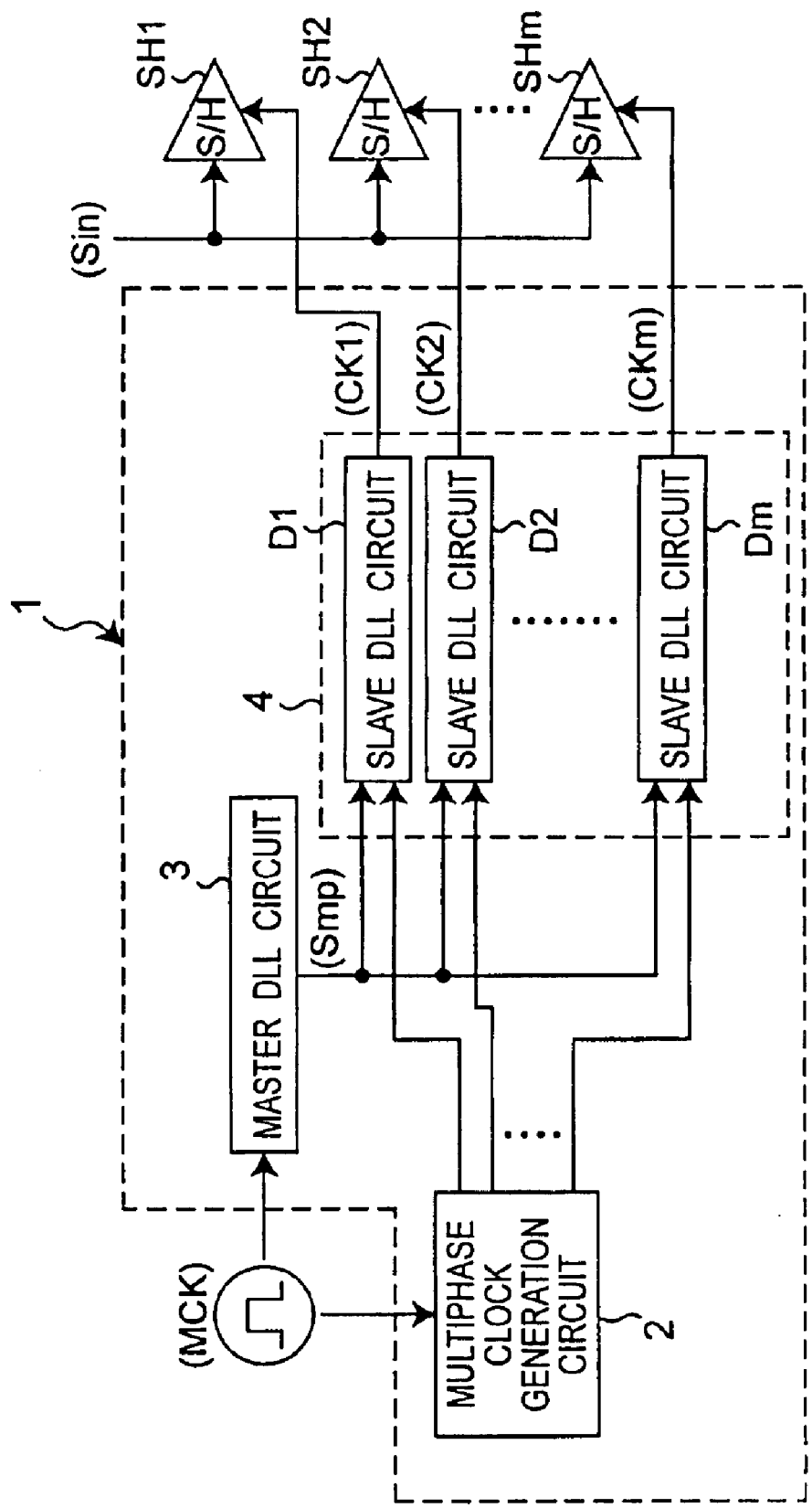
FIG. 1 is a block diagram showing a clock signal generation circuit according to a first embodiment of the present invention.

FIG. 1 is a block diagram showing a clock signal generation circuit according to a first embodiment of the present invention. FIG. 1 shows a case of using the clock signal generation circuit for S/H circuits for interleave operations.

In FIG. 1, the clock signal generation circuit 1 generates multiphase clock signals CK1 to CKm of m (m is an integer larger than 1) phases in accordance with a master clock signal MCK having a predetermined frequency and outputs the multiphase clock signals CK1 to CKm to m corresponding S/H circuits SH1 to SHm, respectively.

Figure 2:
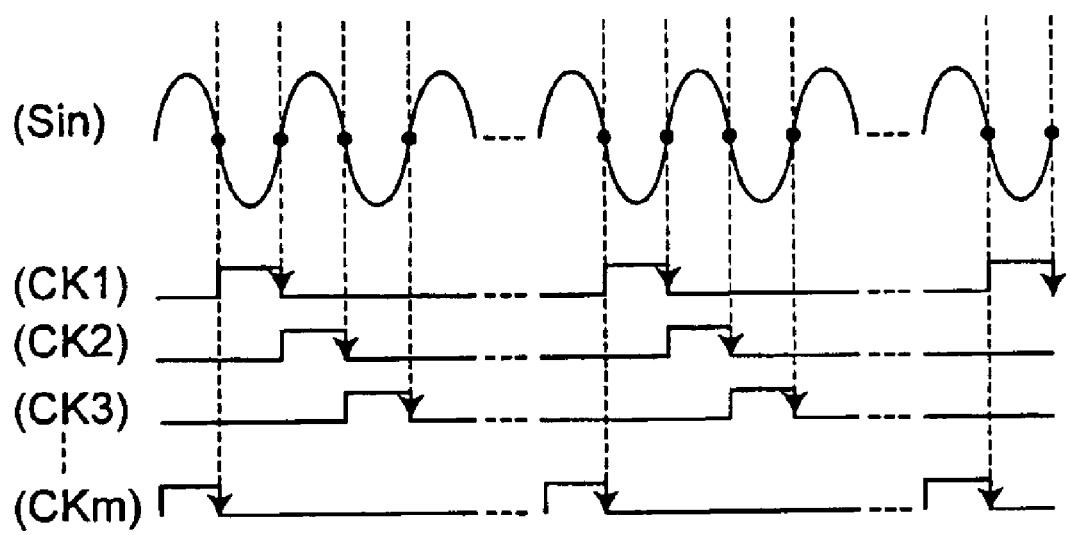
FIG. 2 is a timing chart showing an ideal timing of an analog input signal Sin and multiphase clock signals CK1 to CKm.

FIG. 2 is a timing chart showing an ideal timing of an analog input signal Sin supplied to the S/H circuits SH1 to SHm and the multiphase clock signals CK1 to CKm.

As shown in FIG. 2, the S/H circuits SH1 to SHm sample the input signal Sin for a plurality of channels while temporally and slightly shifting the input signal Sin by using the clock signals CK1 to CKm of m phases supplied from the clock signal generation circuit 1. Thus, it is possible to lower a sampling frequency per channel and realize operations at a high power efficiency. Thereby, it is possible to realize high-speed sampling while reducing power consumption.

When assuming that the whole sampling frequency is Fs, the sampling frequency Fm per channel is shown by the following expression (1).

$$Fm=Fs/m \quad (1)$$

For above formula (1), it is possible to raise the sampling frequency Fs of all S/H circuits by increasing the number of channels m instead of raising the sampling frequency Fm per channel.

Moreover, making the S/H circuits SH1 to SHm perform interleave operations also shows an effect for reduction of power consumption when a sampling frequency exceeds 100 MHz. When operating an analog CMOS while securing a high resolution at tens of MHz or more, an operation speed is not proportional to an input power due to a limit of a device. That is, a power consumption increases in proportion to 1.5th to second power of a sampling frequency, and therefore a large effect for an input power is not obtained, and a power efficiency is deteriorated. However, it is possible to perform an interleave operation at a high power efficiency every channel by increasing the number of channels without adding an input power to raise an operation speed of one channel. Thus, the power consumption can be reduced while maintaining a proportional relationship between the power consumption to the sampling frequency.

The clock signal generation circuit 1 is constituted by a multiphase clock generation circuit 2, master DLL (Delay-Locked Loop) circuit 3, and slave DLL section 4 which is comprised of slave DLL circuits D1 to Dm.

The multiphase clock generation circuit 2 generates internal clock signals CKA1 to CKAm in accordance with a master clock signal MCK having a predetermined frequency and outputs the clock signals CKA1 to CKAm to the corresponding slave DLL circuits D1 to Dm. Moreover, the multiphase clock generation circuit 2 delays the internal clock signals CKA1 to CKAm by a half cycle of the master clock signal MCK to generate delay internal clock signals CKB1 to CKBm, and outputs the clock signals CKB1 to CKBm to the corresponding slave DLL circuits D1 to Dm.

The slave DLL circuits D1 to Dm of the slave DLL section 4 delay the correspondingly delay internal clock signals CKB1 to CKBm to generate the multiphase clock signals CK1 to CKm to be applied to the corresponding S/H circuits SH1 to SHm. Moreover, the master DLL circuit 3 generates a first pulse signal Smp in accordance with the master clock signal MCK and applies the pulse signal Smp to the slave DLL circuits D1 to Dm. The slave DLL circuits D1 to Dm control delay values of the delay internal clock signals CKB1 to CKBm in accordance with the master clock signal MCK, first pulse signal Smp, and internal clock signals CKA1 to CKAm and multiphase clock signals CK1 to CKm.

Figure 3:
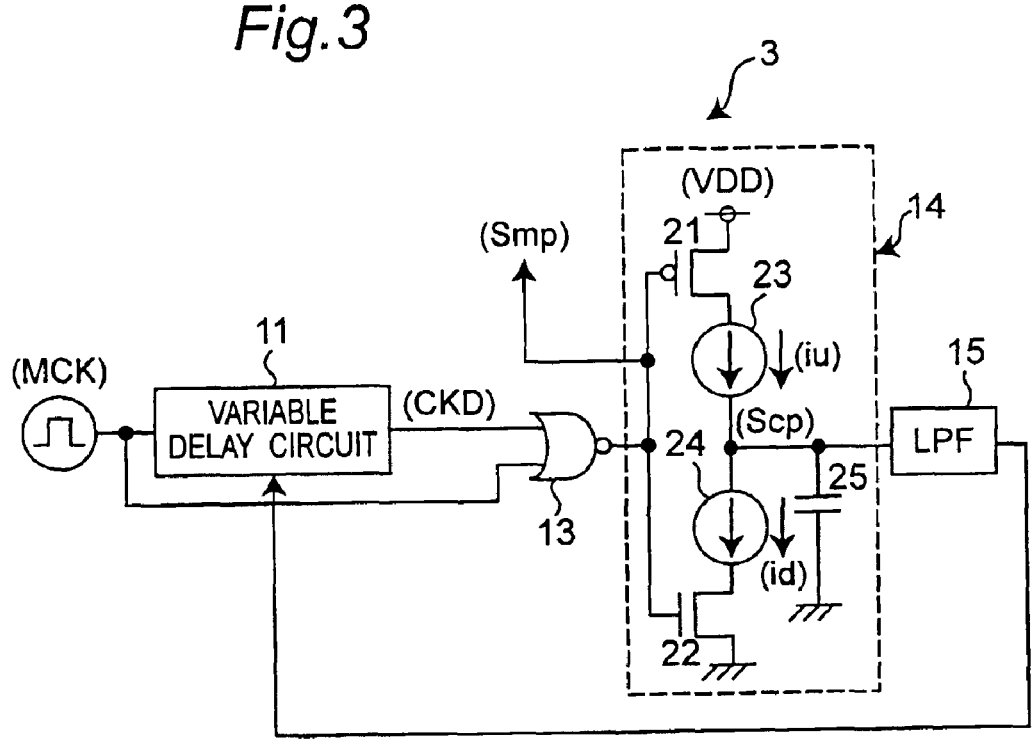
FIG. 3 is a circuit diagram showing an example of a circuit configuration of a master DLL circuit 3 shown in FIG. 1.

FIG. 3 shows a configuration of the master DLL circuit 3. In FIG. 3, the masker DLL circuit 3 includes a variable delay circuit 11, NOR circuit 13, charge pump circuit 14, and low-pass filter (hereafter referred to as "LPF") 15. The variable delay circuit 11 varies a delay value of an input signal in accordance with an input control signal. In specific, the input master clock signal MCK is delayed by the variable delay circuit 11 to output a first delay clock signal CKD which is applied to one input terminal of the NOR circuit 13.

The master clock signal MCK is applied to the other input terminal of the NOR circuit 13 and an output signal of the NOR circuit 13 is supplied to the slave DLL circuits D1 to Dm as a first pulse signal Smp. The variable delay circuit 11 constitutes a first variable delay circuit, the NOR circuit 13 constitutes a first pulse signal generation circuit, the charge pump circuit 14 constitutes a first charge pump circuit, the LPF 15 constitutes a first low-pass filter, and an output signal of the LPF 15 forms a first control signal which is fed back to the variable delay circuit 11.

The charge pump circuit 14 includes a P-channel MOS transistor (hereafter referred to as PMOS transistor) 21, N-channel MOS transistor (hereafter referred to as NMOS transistor) 22, constant-current sources 23 and 24, and a first capacitor 25. The PMOS transistor 21, constant-current sources 23 and 24, and NMOS transistor 22 are connected in series between a power supply voltage VDD and a ground voltage. The first capacitor 25 is connected between a joint between the constant-current sources 23 and 24 and the ground voltage, and the first pulse signal Smp is inputted to gates of the PMOS transistor 21 and NMOS transistor 22.

A signal at the joint between the constant-current sources 23 and 24 and the capacitor 25 serves as an output signal Scp of the charge pump circuit 14 and the output signal Scp is supplied to the variable delay circuit 11 as the first control signal through the LPF 15. When assuming that the delay time of the variable delay circuit 11 is a first delay time, the first delay time of the variable delay circuit 11 is shortened when the voltage of the first control signal supplied from the LPF 15 is lowered. And the first delay time of the variable delay circuit 11 is lengthened when the voltage of the first control signal is raised.

Figure 4:
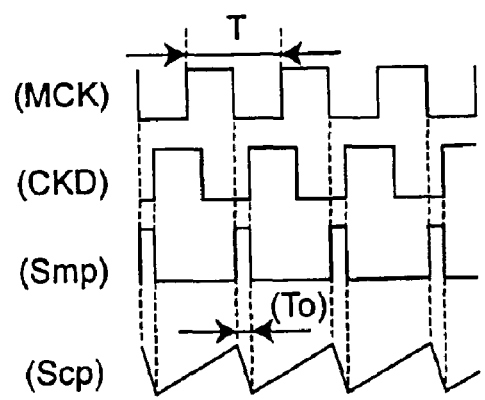
FIG. 4 is a timing chart showing signal waveforms of various sections shown in FIG. 3.

In the case of the above configuration, FIG. 4 is a timing chart showing signal waveforms of various sections of the master DLL circuit 3 shown in FIG. 3 and operations of the master DLL circuit 3 are described in detail below by referring to FIG. 4.

When a high-level pulse of the first pulse signal Smp is outputted from the NOR circuit 13, the PMOS transistor 21 is turned off, the NMOS transistor 22 is turned on, and the voltage of the output signal Scp serving as the first control signal is lowered.

On the other hand, when the signal level at the output terminal of the NOR circuit 13 becomes low, the PMOS transistor 21 is turned on, the NMOS transistor 22 is turned off, and the voltage level of the output signal Scp is raised. Therefore, when the first delay time of the variable delay circuit 11 increases, the output voltage of the LPF 15 is lowered and the first delay time of the variable delay circuit 11 decreases. Thus, a negative feedback loop is formed and the first delay time of the variable delay circuit 11 and the output voltage of the LPF 15 converge to constant values, respectively.

In this configuration, the voltage drop amplitude and voltage rise amplitude of the output signal Scp of the charge pump circuit 14 must be equal to each other. When assuming that the constant-current sources 23 and 24 respectively have ideal constant-current characteristics, the following expression (2) is effected.

$$id \cdot To/Cp = iu \cdot (T-To)/Cp \quad (2)$$

In the above expression (2), "iu" denotes a constant current supplied from the constant-current source 23 and "id" denotes a constant current supplied from the constant-current source 24, "Cp" denotes a capacity of the capacitor 25, "T" denotes a cycle of the master clock signal MCK, and "To" denotes a pulse width of the pulse signal Smp corresponding to the first delay time of the variable delay circuit 11.

The following expression (3) can be obtained from the above expression (2).

$$To = iu \cdot T/(id+iu) \quad (3)$$

That is, the first delay time To of the variable delay circuit 11 is decided only by the current ratio between the two currents iu and id circulating through the charge pump circuit 14 and the cycle T of the master clock signal MCK in accordance with a negative feedback loop. Therefore, when the master clock signal MCK includes no jitter and is stable, the pulse width To of the first pulse signal Smp includes less jitter. Thus, it is hardly influenced by an operational environment change such as a power supply voltage fluctuation.

Figure 5:
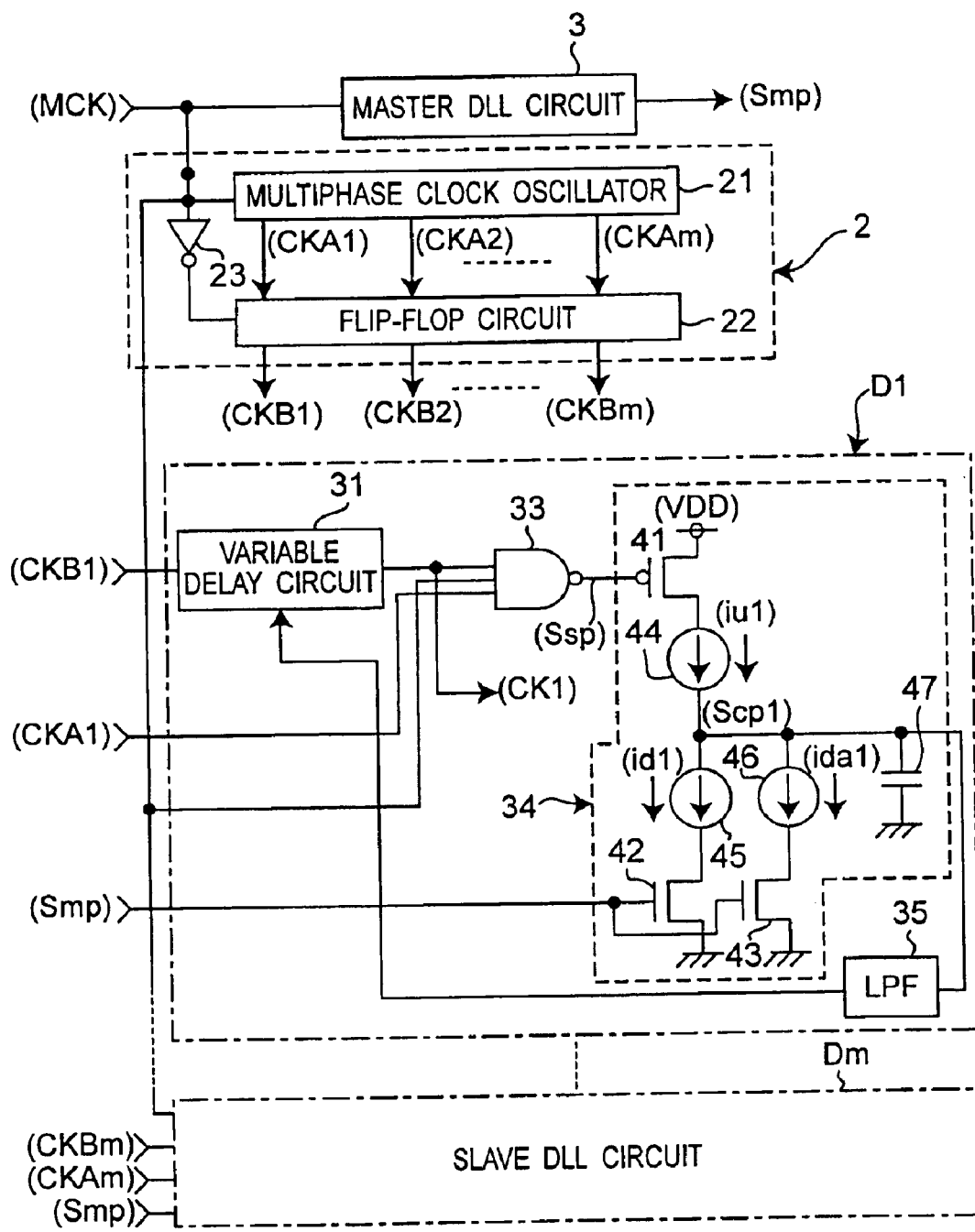
FIG. 5 is a block diagram showing a configuration of a multiphase clock generation circuit 2 and a circuit example of a master DLL circuit D1 shown in FIG. 1.

FIG. 5 is an illustration showing a configuration example of the multiphase clock generation circuit 2 and the slave DLL circuits D1 to Dm of the slave DLL section 4. Because the slave DLL circuits D1 to Dm have the same circuit configuration, FIG. 5 shows internal circuits of only the slave DLL circuit D1 as an example to be described below.

In FIG. 5, the multiphase clock generation circuit 2 includes a multiphase clock oscillator 21, a flip flop circuit 22 having m D-type flip flops, and an inverter 23. The multiphase clock oscillator 21 generates the internal multiphase clock signals CKA1 to CKAm in accordance with the input master clock signal MCK and the signals CKA1 to CKAm are applied to D-type input terminals of corresponding D-type flip flops of the flip flop circuit 22, respectively. The signals CKA1 to CKAm are also supplied to the corresponding slave DLL circuits D1 to Dm, respectively.

A signal obtained by inverting the signal level of the master clock signal MCK by the inverter 23 is supplied to each D-type flip flop of the flip flop circuit 22 as a clock signal. The flip flop circuit 22 delays the input internal multiphase clock signals CKA1 to CKAm by a half cycle of the master clock signal MCK to generate the delay internal clock signals CKB1 to CKBm which are supplied to the corresponding slave DLL circuits D1 to Dm, respectively.

The slave DLL circuit D1 is constituted by a variable delay circuit 31, NAND circuit 33, charge pump circuit 34, and LPF 35. When assuming that the delay time of the variable delay circuit 31 is a second delay time, the variable delay circuit 31 varies the second delay time to an input signal (i.e., CKB1) in accordance with an input control signal. That is, the input delay internal clock signal CKB1 is delayed by the variable delay circuit 31 to thereby output the clock signal CK1 of the multiphase clock signals. The clock signal CK1 is supplied to the S/H circuit SH1 and also supplied to a corresponding input terminal of the NAND circuit 33 as a second delay signal.

The master clock signal MCK and clock signal CKA1 are inputted to corresponding input terminals of the NAND circuit 33 and an output signal of the NAND circuit 33 is supplied to the charge pump circuit 34 as a second pulse signal Ssp. The variable delay circuit 31 constitutes a second variable delay circuit, the NAND circuit 33 constitutes a second pulse signal generation circuit, the charge pump circuit 34 constitutes a second charge pump circuit, and the LPF 35 constitutes a second low-pass filter and an output signal (Scp1) of the LPF 35 forms a second control signal which is fed back to the variable delay circuit 31.

The charge pump circuit 34 includes a PMOS transistor 41, NMOS transistors 42 and 43, constant-current sources 44 and 45, a current-output D/A converter (hereafter referred to as "DAC") 46, and a capacitor 47. The PMOS transistor 41, constant-current sources 44 and 45, and NMOS transistor 42 are connected in series between a power supply voltage VDD and a ground voltage. A series circuit of the DAC 46 and the NMOS transistor 43 are connected in parallel to the capacitor 47 between the joint between the constant-current sources 44 and 45 and the ground voltage. The second pulse signal Ssp is supplied to the gate of the PMOS transistor 41 and the first pulse signal Smp is supplied to the gates of the NMOS transistors 42 and 43, respectively.

A signal appearing at the common joints of the constant-current sources 44 and 45, DAC 46, and capacitor 47 serves as an output signal Scp1 of the charge pump circuit 34 and the output signal Scp1 is supplied to the variable delay circuit 31 as a second control signal after passing through the LPF 35. In this configuration, the variable delay circuit 31 varies the second delay time in a manner such that the second delay time is shortened when the voltage level of the second control signal supplied from the LPF 35 is lowered and that the second delay time is lengthened when the voltage level of the second control signal is raised. The DAC 46 varies the amount of an output current ida1 of an analog value in accordance with an input digital signal. Thus, it is possible to control the voltage drop speed of the output signal Scp1 of the charge pump circuit 34 by controlling the output current ida1. The PMOS transistor 41 and constant-current source 44 constitute a charge circuit. The NMOS transistors 42 and 43, constant-current source 45, and DAC 46 constitute a discharge circuit, and the capacitor 47 constitutes a second capacitor.

Figure 6:
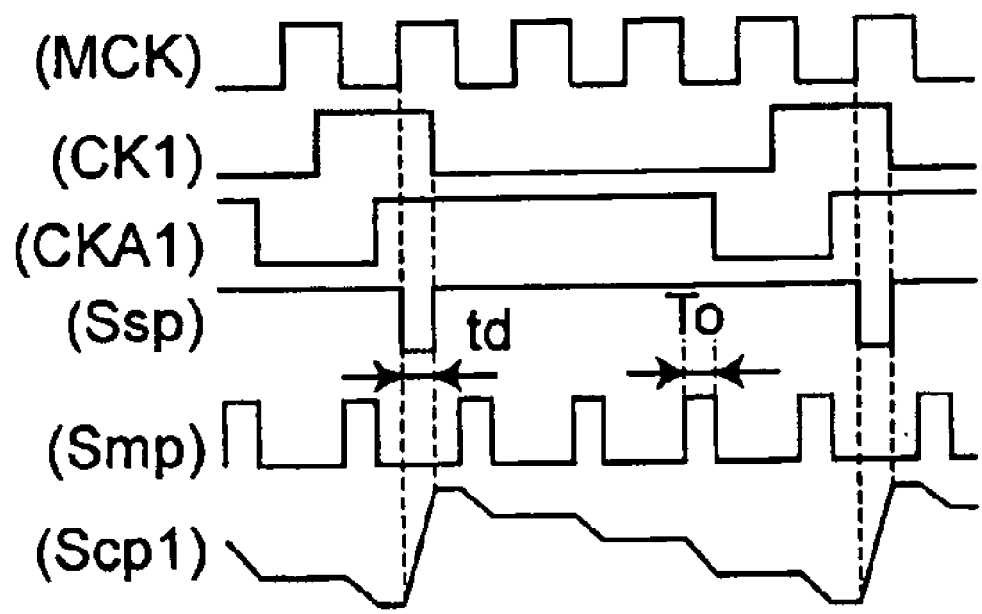
FIG. 6 is a timing chart showing signal waveforms of various sections shown in FIG. 5.

In the above configuration, FIG. 6 is a timing chart showing signal waveforms of various components of the slave DLL circuit D1 shown in FIG. 5. Operations of the slave DLL circuit D1 are described in detail as below by referring to FIG. 6 which shows an example in a case of m=4.

When the first pulse signal Smp of a high level is supplied to the slave DLL circuit D1 under the condition of the second pulse signal Ssp being high level, the PMOS transistor 41 is turned off, the NMOS transistors 42 and 43 are turned on, and the voltage level of the output signal Scp1 of the charge pump circuit 34 is lowered.

On the other hand, when the second pulse signal Ssp of a low-level is outputted from the NAND circuit 33 under the condition of the first pulse signal Smp being low-level, the PMOS transistor 41 is turned on, NMOS transistors 42 and 43 are turned off, and the voltage level of the output signal Scp1 is raised. Therefore, when the second delay time td of the variable delay circuit 31 increases, the output voltage level of the LPF 35 is lowered, resulting in that the second delay time of the variable delay circuit 31 is decreased. Thus, the slave DLL circuit D1 forms a negative feedback loop in the same manner as that of the master DLL circuit 3, and the second delay time of the variable delay circuit 31 and the voltage level of the second control signal Scp1 output of the LPF 35 converge to constant values, respectively.

In this case, the voltage drop amplitude and voltage rise amplitude of the output signal Scp1 of the charge pump circuit 34 become equal to each other. Therefore, when no current is outputted from the DAC 46, the following expression (4) is effected.

$$iu1 \cdot td/Cp1 = m \cdot id1 \cdot To/Cp1 \qquad (4)$$

In the above expression (4), iu1 denotes a constant current supplied from the constant-current source 44, id1 denotes a constant current supplied from the constant-current source 45, Cp1 denotes a capacity of the capacitor 47, td denotes the pulse width of the second pulse signal Ssp corresponding to the second delay time of the variable delay circuit 31, and To denotes the pulse width of the first pulse signal Smp corresponding to the first delay time of the variable delay circuit 11.

The following expression (5) can be obtained from the above expression (4).

$$td = m \cdot id1 \cdot To/iu1 \qquad (5)$$

That is, the pulse width td showing the second delay time of the variable delay circuit 31 is decided in accordance with the first delay time To of the variable delay circuit 11 in the master DLL circuit 3 and the ratio between output currents of the constant-current sources 44 and 45 of the charge pump circuit 34. Therefore, when the first delay time of the variable delay circuit 11 in the master DLL circuit 3 is stable, the second delay time td of the variable delay circuit 31 becomes a stable value without being influenced by the jitter due to a power supply fluctuation.

Moreover, since the DAC 46 is connected in parallel to the constant-current source 45, it is possible to adjust the pulse width td in accordance with a digital value of the second control signal Scp1 applied to the DAC 46. When assuming that the change of the pulse width td due to the current ida1 supplied from the DAC 46 is Δtd, the change value Δtd is represented by the following expression (6).

$$\Delta td = m \cdot ida1 \cdot To/id1 \qquad (6)$$

In this case, when assuming m=4, To=2 ns, and id1=4 mA, the current ida1 to be adjusted every Δtd=0.2 ps becomes 0.1 µA which is a current value to be comparatively easily set. This is realized by operating the slave DLL circuits D1 to Dm on the basis of a pulse having a short pulse width To. The first pulse signal Smp having the pulse width To serves as a basis of a delay time criterion of the final output signals (CK1 to CKm) of the slave DLL circuits D1 to Dm, the first pulse signal must be stable without being influenced by a power supply fluctuation. This is realized by stably supplying the first pulse signal from the master DDL circuit 3 to the slave DLL circuits D1 to Dm. That is, it is achieved to provide a clock generation circuit which is hardly affected by a power supply fluctuation and capable of controlling a minute delay time by including the master DLL circuit 3 and slave DLL circuits D1 to Dm in the first embodiment.

Moreover, the value of 0.1 µA of the current ida1 for adjustment every Δtd=0.2 ps is easily generated by an integrated circuit and makes it possible to change the pulse width td every 0.2 ps. Moreover, to keep the voltage amplitude of the output signal Scp1 of the charge pump circuit 34 at approx. 1 V, the capacity Cp1 of the capacitor 47 becomes equal to 3.5 pF because iu1 is equal to 0.5 mA when assuming td=1 ns. This capacity value is possible to easily constitute a capacitor in an LSI.

Although the LPF 15 is provided at the output side of the master DLL circuit 3 in the configuration shown in FIG. 3, it is noted that the LPF 15 can be omitted. When the LPF 15 is omitted, the output signal Scp is directly fed back to the variable delay circuit 11 as the first control signal. Moreover, although the LPF 35 is provided at the output side of each of the slave DLL circuits D1 to Dm, the LPF 35 can be omitted. When the LPF 15 is omitted, the output signal Scp1 of the charge pump circuit 34 is directly fed back to the variable delay circuit 31 as the second control signal in the example of the slave DLL circuit D1. This can be also applied to the slave DLL circuits D2 to Dm.

Thus, the clock signal generation circuit of the first embodiment generates the first pulse signal Smp having the pulse width To in accordance with the master clock signal MCK by the master DLL circuit 3, and moreover generates the second pulse signal Ssp having the pulse width td in accordance with the first pulse signal Smp by the slave DLL circuits D1 to Dm, and makes the skew values of the multiphase clock signals CK1 to CKm generated by the slave DLL circuits D1 to Dm proportional to the delay time To of the master DLL circuit 3. Thus, it is possible to reduce the jitter of the generated multiphase clock signals and it is possible to correct a skew of a psec order. In specific, it is possible to reduce a skew value to 2 ps or less even in the case of a resolution being 10 bits when supplying a multiphase clock signal to an S/H circuit for interleave operations.

Moreover, since the discharge current of the capacitor 47 in the charge pump circuit 34 in each of the slave DLL circuits D1 to Dm is changed by the DAC 46, it is possible to digitally correct a skew value of a multiphase clock signal to be generated.

Second Embodiment

Figure 7:
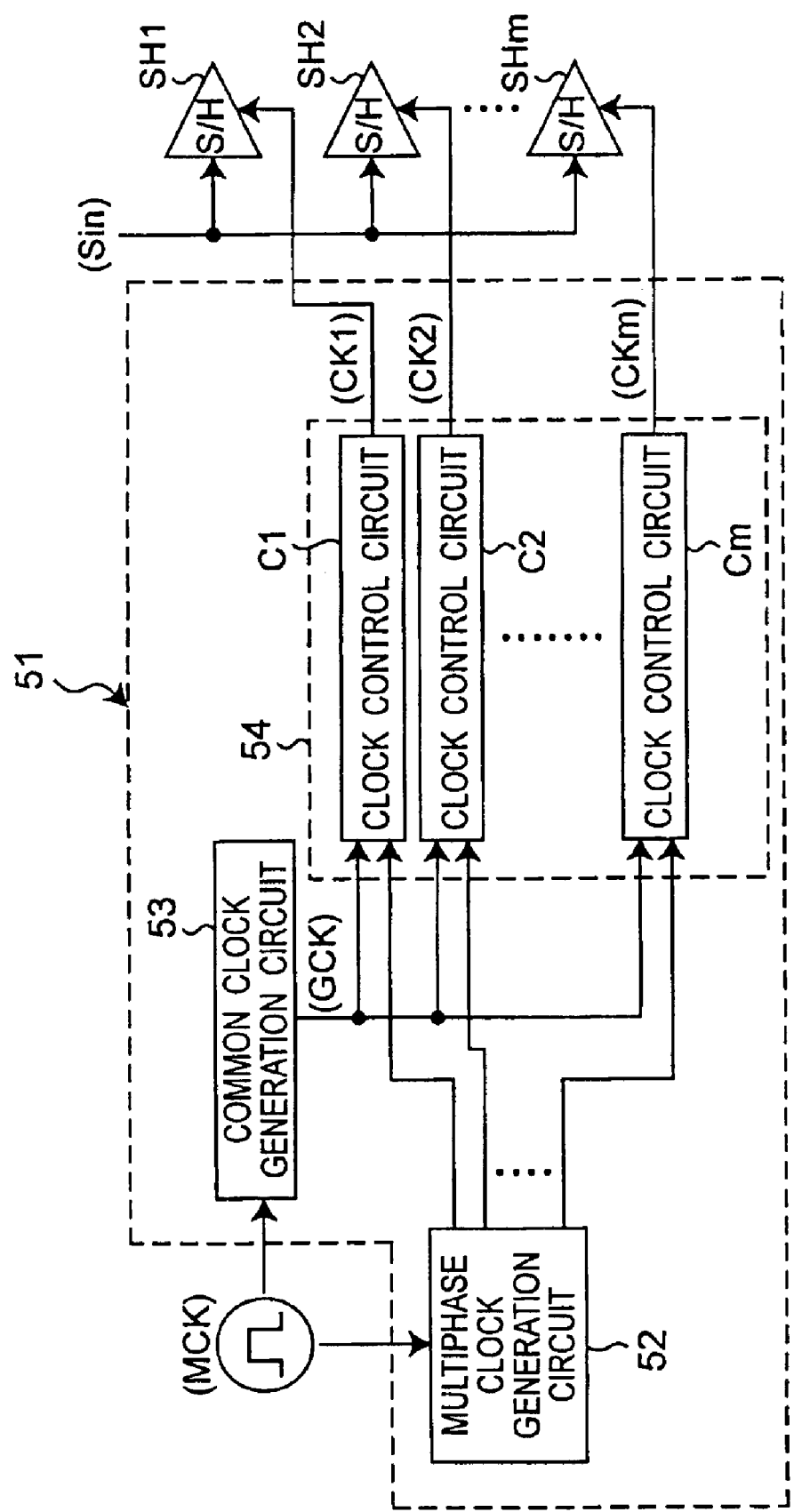
FIG. 7 is a block diagram showing a clock signal generation circuit according to a second embodiment of the present invention.

FIG. 7 is a block diagram showing a clock signal generation circuit 51 according to a second embodiment of the present invention. FIG. 7 shows a case of using the clock signal generation circuit for S/H circuits for interleave operations. In FIG. 7, components same as or similar to those in FIG. 1 are designated by the same symbol and the description thereof is omitted.

In FIG. 7, the clock signal generation circuit 51 generates multiphase signals CK1 to CKm of m (m is an integer larger than 1) phases in accordance with a maser clock signal MCK having a predetermined frequency and the generated multiphase signals CK1 to CKm are supplied to m corresponding S/H circuits SH1 to SHm. Since the timing chart showing the ideal timing of an analog input signal Sin inputted to the S/H circuits SH1 to SHm and multiphase clock signals CK1 to CKm are the same as FIG. 2, the description thereof is omitted.

The clock signal generation circuit 51 includes a multiphase clock-generation circuit 52, common clock generation circuit 53, and clock control section 54 which is comprised of clock control circuits C1 to Cm.

The multiphase clock generation circuit 52 generates internal multiphase clock signals CKC1 to CKCm in accordance with a master clock signal MCK having a predetermined frequency and the internal multiphase clock signals CKC1 to CKCm are applied to the clock control circuits C1 to Cm, respectively.

The common clock generation circuit 53 generates a low-level pulse signal GCK (referred to as "third pulse signal" hereinafter) having a preset pulse width when the master clock signal MCK rises. The third pulse signal GCK of the low-level pulse is also referred to as a global clock signal GCK. The clock control circuits C1 to Cm generates the multiphase clock signals CK1 to CKm, respectively in a manner such that the multiphase clock signals CK1 to CKm rise in level at a timing when the correspondingly internal clock signals CKC1 to CKCm rise, and fall in level at a timing when the global clock signal GCK becomes high-level.

Figure 8:
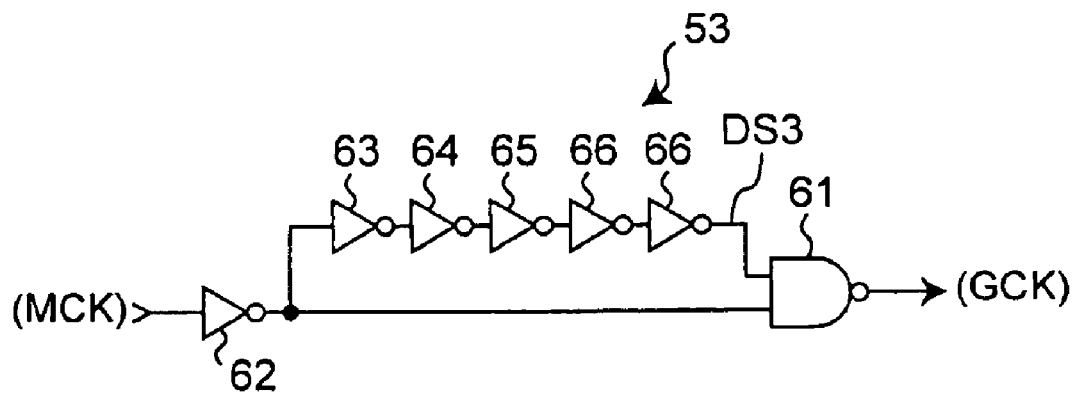
FIG. 8 is a circuit diagram showing an example of a circuit configuration of a common clock generation circuit 53 shown in FIG. 7.

FIG. 8 is an illustration showing a circuit configuration example of the common clock generation circuit 53. In FIG. 8, the common clock generation circuit 53 includes a NAND circuit 61 and inverters 62 to 67. The master clock signal MCK is supplied to one input terminal of the NAND circuit 61 through the inverter 62. The inverters 63 to 67 are connected in series between the output terminal of the inverter 62 and the other input terminal of the NAND circuit 61.

The signal level of the master clock signal MCK is inverted by the inverter 62 and the output signal thereof is inputed to one input terminal of the NAND circuit 61. Also, the output signal of the inverter 62 is delayed by a third delay time through the series circuit of the inverters 63 to 67, and the resultant delayed signal DS3 having an inverted signal level of the signal MCK is inputted to the other input terminal of the NAND circuit 61. Thus, the NAND circuit 61 generates the global clock signal GCK. The clock signals CKC1 to CKCm form internal clock signals, the global clock signal GCK forms a third pulse signal, and the signal DS3 outputted from the inverter 67 forms a third delay signal.

Figure 9:
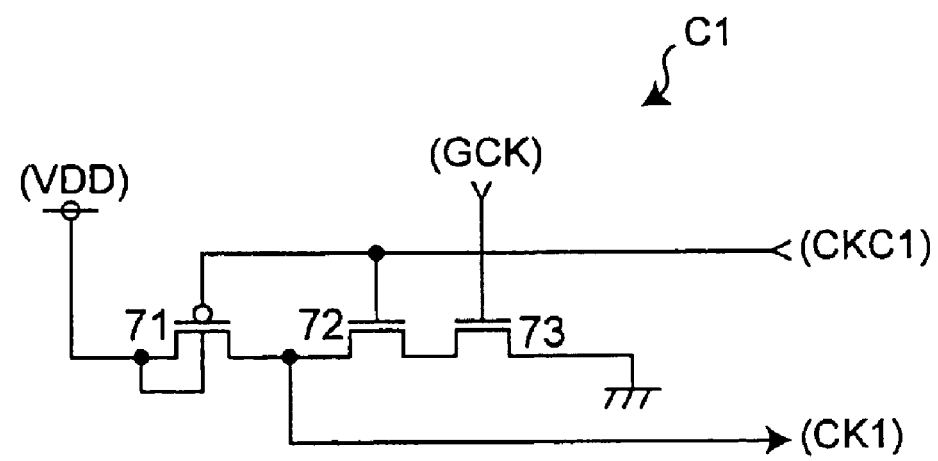
FIG. 9 is a circuit diagram showing an example of a circuit configuration of a clock control circuit C1 shown in FIG. 7.

FIG. 9 is an illustration showing a circuit configuration example of the clock control circuit C1 as one of the clock control circuits C1 to Cm which have the same circuit configuration. An illustration showing the circuit configuration of the clock control circuits C2 to Cm is omitted and the clock control circuit C1 is described below as a representative example.

In FIG. 9, the clock control circuit Cl includes a PMOS transistor 71 and NMOS transistors 72 and 73. The PMOS transistor 71 and NMOS transistor 72 constitute an output circuit and the NMOS transistor 73 constitutes an output control circuit.

The PMOS transistor 71 and NMOS transistors 72 and 73 are connected in series between a power supply voltage VDD and a ground voltage. The joint between the PMOS transistor 71 and NMOS transistor 72 constitutes an output terminal of the clock control circuit C1 to generate the clock signal CK1. Gates of the PMOS transistor 71 and NMOS transistor 72 are commonly connected the input terminal of the internal clock signal CKC1 which is supplied from the multiphase clock generation circuit 52. Moreover, the global clock signal GCK is inputted to the gate of the NMOS transistor 73 from the common clock generation circuit 53.

Figure 10:
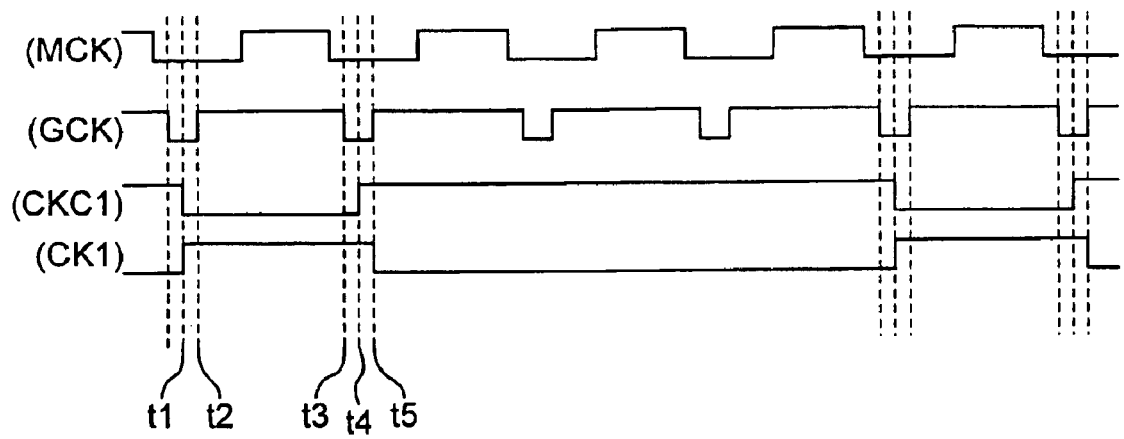
FIG. 10 is a timing chart showing signal waveforms of various sections shown in FIG. 9.
Figure 11:
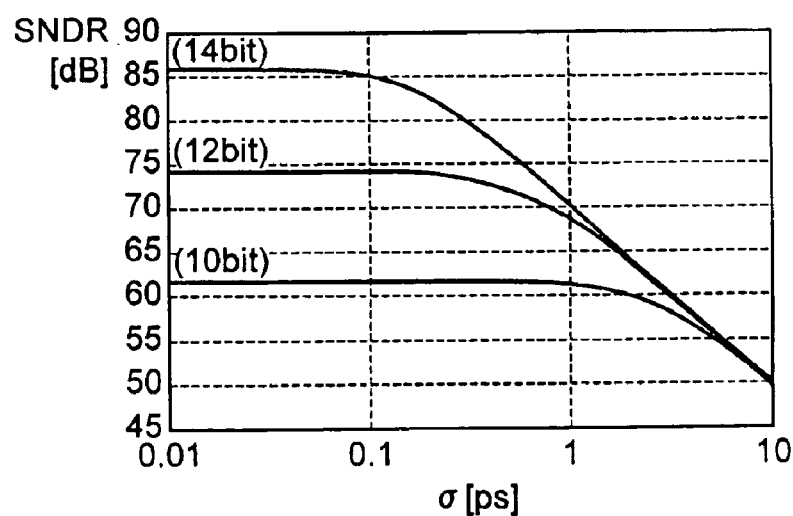
FIG. 11 is a graph showing a relation between a skew and SNDR in a conventional multiphase clock signal generation circuit.

In the above configuration, FIG. 10 is a timing chart showing signal waveforms of various sections of the clock control circuit C1 shown in FIG. 9, and operations of the clock control circuit C1 are described in detail below by referring to FIG. 10 in a case of m=4.

When the clock signal CKC1 falls to low level at the timing t1, the PMOS transistor 71 is turned on and the NMOS transistor 72 is turned off. Therefore, the clock control circuit C1 raises the clock signal CK1 to high level independently of the signal level of the global clock signal GCK.

Then, when the global clock signal GCK is low-level in a duration between the timings t1 to t2, the NMOS transistor 73 is turned off. However, because the NMOS transistor 72 is already turned off, the clock signal CK1 remains at high level. Then, when the clock signal CKC1 rises to high level at the timing t4 while the global clock signal GCK is low-level, the PMOS transistor 71 is turned off and the NMOS transistor 72 is turned on. However, because the NMOS transistor 73 is already turned off, the clock signal CK1 remains at high level. Then, when the global clock signal GCK rises to high level at the timing t5, the NMOS transistor 73 is turned on and the clock signal CK1 falls to low level.

Thus, in the second embodiment, the clock control circuits C1 to Cm are operated so that the clock signals CK1 to CKm fall to low level at the timing when the global clock signal GCK rises to high level. Thereby, it is possible to reduce the skew of a generated multiphase clock signal by a simple circuit. In specific, it is possible to reduce a skew value to 2 ps or less even for a resolution of 10 bits when supplying a multiphase clock signal to an S/H circuit for interleave operations.

As described above, according to a clock signal generation circuit of the present invention, a master DLL circuit section generates a first control signal whose voltage is changed in accordance with a first pulse signal having the pulse width of a first delay time and adjusts the first delay time so that the first delay time has a predetermined value in accordance with the generated first control signal. Each of the slave DLL circuits generates a second control signal whose voltage is changed in accordance with the first pulse signal and a second pulse signal having the pulse width of a second delay time and adjusts the second delay time to have a predetermined value in accordance with the generated second control signal. Thus, it is possible to make the skew value of a clock signal generated by each slave DLL circuit proportional to the first delay time. Therefore, it is possible to reduce the jitter of a generated multiphase clock signal and perform skew correction at psec order. Particularly, it is possible to decrease a skew value to 2 ps or less even for a resolution of 10 bits when supplying a multiphase clock signal to an S/H circuit for interleave operations.

Specifically, each slave DLL circuit adjusts the discharge current or charge current of the second capacitor in accordance with an externally input digital signal. Thus, it is possible to digital-correct the skew value of a multiphase clock signal to be generated.

Moreover, each clock control circuit controls the change point of signal levels of a corresponding internal clock signal output from the multiphase clock generation circuit so that the change point coincides with the change point of the signal levels of the third pulse signal. Therefore, it is possible to reduce the skew of a generated multiphase clock signal by a simple circuit, particularly to reduce a skew value to 2 ps or less even for a resolution of 10 bits when supplying a multiphase clock signal to an S/H circuit for interleave operations.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A clock signal generation circuit for generating multiphase clock signals in accordance with a master clock signal having a predetermined frequency, comprising:

a master DLL circuit section adapted to generate a first delay signal obtained by delaying the master clock signal by a first delay time and generate a first pulse signal having a pulse width of the first delay time in accordance with the master clock signal and the first delay signal;

a multiphase clock generation circuit section adapted to generate multiphase internal clock signals in accordance with the master clock signal and generate delay internal clock signals obtained by delaying the multiphase internal clock signals, respectively; and a slave DLL circuit section constituted by slave DLL circuits each for delaying, by a second delay time, corresponding one of the delay internal clock signals generated by the multiphase clock generation circuit section, thereby outputting the delayed delay internal clock signals which form the multiphase clock signals, wherein the master DLL circuit section generates a first control signal which is changed in voltage in accordance with the first pulse signal, and adjusts the first delay time to have a first predetermined value in accordance with the generated first control signal, and wherein each of the slave DLL circuits generates a second pulse signal having a pulse width of the second delay time, and generates a second control signal which is changed in voltage in accordance with the first and second pulse signals, and adjusts the second delay time to have a second predetermined value in accordance with the generated second control signal.

2. The clock signal generation circuit according to claim 1, wherein the master DLL circuit section comprises:

a first variable delay circuit which is fed back with the first control signal and delays the master clock signal by the first delay time in accordance with the fed-back first control signal, and generates the first delay signal;

a first pulse signal generation circuit for generating the first pulse signal in accordance with the first delay signal and the master clock signal;

a first charge pump circuit for charging and discharging a first capacitor in accordance with the first pulse signal; and a first low-pass filter for integrating a voltage at a high voltage side of the first capacitor and outputting the integrated voltage to be fed to the first variable delay circuit as the first control signal.

3. The clock signal generation circuit according to claim 1, wherein each of the slave DLL circuits comprises:

a second variable delay circuit which is fed back with the second control signal and delays the corresponding delay internal clock signal by the second delay time in accordance with the fed-back second control signal and outputting the delayed delay internal clock signal as the clock signal for forming the multiphase clock signals;

a second pulse signal generation circuit for generating the second pulse signal in accordance with the clock signal outputted from the second variable delay circuit, the corresponding internal clock signal and the master clock signal;

a second charge pump circuit for charging and discharging a second capacitor in accordance with the first and second pulse signals; and a second low-pass filter for integrating a voltage at a high voltage side of the second capacitor and outputting the integrated voltage to the second variable delay circuit as the second control signal.

4. The clock signal generation circuit according to claim 2, wherein each of the slave DLL circuits comprises:

a second variable delay circuit which is fed back with the second control signal and delays the corresponding delay internal clock signal by the second delay time in accordance with the fed-back second control signal and outputting the delayed delay internal clock signal as the clock signal for forming the multiphase clock signals;

a second pulse signal generation circuit for generating the second pulse signal in accordance with the clock signal outputted from the second variable delay circuit (31), the corresponding internal clock signal and the master clock signal;

a second charge pump circuit for charging and discharging a second capacitor in accordance with the first and second pulse signals; and a second low-pass filter for integrating a voltage at a high voltage side of the second capacitor and outputting the integrated voltage to the second variable delay circuit as the second control signal.

5. The clock signal generation circuit according to claim 3, wherein the second charge pump circuit comprises:

the second capacitor;

a charge circuit for charging the second capacitor in accordance with the second pulse signal; and a discharge circuit for discharging the second capacitor in accordance with the first pulse signal.

6. The clock signal generation circuit according to claim 5, wherein the discharging circuit adjusts a discharge current of the second capacitor in accordance with an externally supplied digital signal.

7. The clock signal generation circuit according to claim 5, wherein the charge circuit adjusts a charge current of the second capacitor in accordance with an externally supplied digital signal.

* * * * *